United States Patent [19]
Hillman

[11] Patent Number: 5,997,649
[45] Date of Patent: Dec. 7, 1999

[54] STACKED SHOWERHEAD ASSEMBLY FOR DELIVERING GASES AND RF POWER TO A REACTION CHAMBER

[75] Inventor: Joseph T. Hillman, Scottsdale, Ariz.

[73] Assignee: Tokyo Electron Limited, Tokyo, Japan

[21] Appl. No.: 09/057,818

[22] Filed: Apr. 9, 1998

[51] Int. Cl.[6] .............................. C23C 16/00; C23F 1/02; H01L 21/00
[52] U.S. Cl. ................. 118/715; 118/723 R; 118/723 E; 156/345; 427/569; 438/758
[58] Field of Search ............................... 118/715, 723 R, 118/723 E, 723 I, 723 IR, 723 ER, 723 AN, 723 MW; 156/345; 427/569; 438/758

[56] References Cited

U.S. PATENT DOCUMENTS

| | | | |
|---|---|---|---|
| 3,369,989 | 2/1968 | Kay et al. . | |
| 4,771,730 | 9/1988 | Tezuka | 118/723 |
| 4,792,378 | 12/1988 | Rose et al. | 156/643 |
| 4,798,165 | 1/1989 | deBoer et al. | 118/715 |
| 4,897,709 | 1/1990 | Yokoyama et al. | 357/68 |
| 5,010,842 | 4/1991 | Oda et al. | 118/723 |
| 5,017,403 | 5/1991 | Pang et al. | 427/39 |
| 5,148,714 | 9/1992 | McDiarmid | 74/89.15 |
| 5,273,588 | 12/1993 | Foster et al. | 118/723 E |
| 5,336,326 | 8/1994 | Karner et al. | 118/723 HC |
| 5,342,471 | 8/1994 | Fukasawa et al. | 156/345 |
| 5,356,476 | 10/1994 | Foster et al. | 118/725 |
| 5,443,787 | 8/1995 | Suzuki et al. | 118/723 MP |
| 5,453,124 | 9/1995 | Moslehi et al. | 118/715 |
| 5,593,511 | 1/1997 | Foster et al. | 148/238 |
| 5,595,606 | 1/1997 | Fujikawa et al. | 118/725 |
| 5,610,106 | 3/1997 | Foster et al. | 437/245 |
| 5,628,829 | 5/1997 | Foster et al. | 118/723 E |
| 5,665,640 | 9/1997 | Foster et al. | 438/680 |
| 5,685,914 | 11/1997 | Hills et al. | 118/723 E |
| 5,685,937 | 11/1997 | Shan et al. | 156/345 |
| 5,716,870 | 2/1998 | Foster et al. | 437/192 |
| 5,846,332 | 12/1998 | Zhao et al. | 118/728 |

FOREIGN PATENT DOCUMENTS

| | | |
|---|---|---|
| 60-98629 | 6/1985 | Japan . |
| 63-187619 | 8/1988 | Japan . |
| 2-234419 | 2/1990 | Japan . |

*Primary Examiner*—Bruce Breneman
*Assistant Examiner*—Luz Alejandro
*Attorney, Agent, or Firm*—Wood, Herron & Evans, LLP

[57] ABSTRACT

A reaction chamber for chemical vapor deposition of a material layer onto a substrate using a process gas comprises a chamber body having an inner wall which defines a process space for containing a substrate, a lid to effectively close the process space, and a planar showerhead positioned inside the chamber body for dispersing a process gas into the process space. A lower insulator plate is positioned on one side of the showerhead between the showerhead and the chamber body for electrically insulating the showerhead from the chamber body, and an upper insulator plate is positioned on the other side of the showerhead between the showerhead and the chamber body and lid for electrically insulating the showerhead from the chamber body and lid. A shelf is formed in the inner wall of the chamber body, and the planar showerhead and upper and lower insulator plates are arranged in a stacked formation and are positioned on the shelf proximate the process space for introducing a process gas to a substrate in the process space.

33 Claims, 3 Drawing Sheets

STACKED SHOWERHEAD ASSEMBLY FOR DELIVERING GASES AND RF POWER TO A REACTION CHAMBER

FIELD OF THE INVENTION

This invention relates generally to chemical vapor deposition (CVD) and plasma-enhanced chemical vapor deposition (PECVD), and more specifically to an apparatus and method for providing a simple, durable gas delivery system for delivering reactant gas constituents in CVD and PECVD reactions while maintaining proper thermal control of the gas delivery components.

BACKGROUND OF THE INVENTION

In the formation of integrated circuits (IC's), it is often necessary to deposit thin material films or layers, such as films containing metal and metalloid elements, upon the surface of a substrate, such as a semiconductor wafer. One purpose of such thin films is to provide conductive and ohmic contacts in the circuits and to yield conductive or barrier layers between the various devices of an IC. For example, a desired film might be applied to the exposed surface of a contact or via hole on an insulating layer of a substrate, with the film passing through the insulating layer to provide plugs of conductive material for the purpose of making electrical connections across the insulating layer.

One well known process for depositing such films is chemical vapor deposition (CVD), in which a film is deposited on a substrate using chemical reactions between various constituent or reactant gases, referred to generally as process gases. In CVD, process gases are pumped into the process space of a reaction chamber containing a substrate. The gases react in the process space proximate the substrate, resulting in one or more reaction by-products. The reaction by-products then deposit onto the substrate to form the desired film on the exposed substrate surfaces.

Another variation of the CVD process, which is also widely utilized, is a plasma-enhanced CVD process or PECVD process in which one or more of the process gases is ionized into a gas plasma to provide energy to the reaction process. PECVD is desirable for lowering the process temperatures and thermal energy that are usually necessary for a proper reaction with standard CVD. In PECVD, electrical energy is delivered to the process gas or gases to form and sustain the plasma, and therefore, less thermal energy is needed for the reaction.

For one such PECVD process, a planar susceptor or planar support structure which supports the substrate in the process space and another planar element in the processing space, such as a process gas supply element, are electrically biased with RF energy to operate as opposing RF electrodes for energizing one or more of the reactant gases into an ionized plasma. Such a method is commonly referred to as a parallel plate PECVD method because the planar susceptor and the other biased planar elements are maintained generally parallel to one another to simulate biased electrical plates with the substrate positioned therebetween. The substrate is also maintained generally parallel to the electrically biased plates or elements.

In CVD and PECVD processes, proper delivery of the process gases to the process space and proximate the substrate is critical. The process gases are delivered to the process space and substrate through a gas delivery system which provides the proper flow and distribution of the gases desirable for the deposition process. Generally, such gas delivery systems contain gas-dispersing elements in the reaction chamber, such as gas injector rings or flat showerheads, which spread the entering process gases around the processing space to insure a uniform distribution and flow of the gases proximate the substrate. Uniform gas distribution and gas flow is desirable for a uniform and efficient deposition process, a dense plasma (for PECVD), and a uniformly deposited film on the substrate. Rings and showerheads are both very viable formats for introducing process gases. For PECVD, showerheads have proven particularly desirable due to their dual function as a biased electrode as well as a gas-dispersing element.

Conventional RF PECVD processes generally utilize a biased, planar gas showerhead opposite a parallel, biased susceptor. One such PECVD process and showerhead structure is disclosed in U.S. Pat. No. 5,567,243, which is commonly owned with the present application. Another suitable showerhead structure is disclosed in U.S. Ser. No. 08/940,779, entitled "Apparatus and Method for Preventing the Premature Mixture of Reactant Gases in CVD and PECVD Reactions." Both the issued patent and pending application are completely incorporated herein by reference in their entireties.

While such showerhead structures produce suitable PECVD films, they require a complex support and biasing assembly. The assembly is coupled to the inside of the reaction chamber proximate the substrate, and therefore, the reaction chamber must be properly configured. The existing showerhead support and biasing assemblies are complicated and expensive to design and fabricate. For example, referring to FIGS. 2, 2A, and 2B of U.S. Pat. No. 5,567,243, complicated showerhead assemblies are illustrated which require numerous precisely machined parts, numerous complex fastening and sealing steps during manufacturing, and complicated electrical couplings to an RF or other electrical source for the PECVD process. Such assemblies are not only difficult and expensive to fabricate, but they are also difficult and expensive to maintain. Still further, the complicated assemblies are difficult to clean.

An additional drawback to existing CVD gas delivery systems, and particularly those utilizing showerheads, is the lack of suitable temperature control of the showerhead during the CVD and PECVD processes. During a chemical vapor deposition process it is desirable to control the surface temperature of the various components in the process space to keep them within a desired temperature range. More specifically, it is desirable to maintain temperature control for the elements which come into contact with the process gases, such as the showerhead, to prevent undesired deposition on those elements. For example, when depositing titanium nitride (TiN), it is desirable to maintain all the surfaces which contact the precursor process gases, $TiCl_4$ and $NH_3$, at a temperature in the range of 125° C. and 225° C. Such temperature control may be possible for the inner walls and lid surfaces of the reaction chamber, because the reaction chamber includes internal and integrated heating and cooling systems. However, those chamber systems generally do not provide temperature control of the showerhead. Therefore, the temperature of the showerhead will be determined by the temperature vagaries of the process space during CVD or PECVD.

Accordingly, it is an objective of the present invention to deliver process gas in a CVD process with an assembly which is simple to fabricate, assemble and maintain.

It is another objective of the present invention to deliver process gas in the CVD process with an assembly which is inexpensive to fabricate, assemble and maintain.

It is still another objective of the invention to deliver CVD process gas while maintaining adequate temperature control of all the surfaces within the process space.

It is specifically an objective of the invention to provide temperature control of a showerhead which contacts the process gases in order to prevent deposition on the showerhead.

It is still another objective of the invention to provide temperature control of a gas-dispersing showerhead during deposition of titanium nitride (TiN), and to reduce chlorine content in the deposited TiN film on a silicon substrate.

It is still another objective to provide a CVD showerhead which is simpler to clean and maintain.

SUMMARY OF THE INVENTION

The above discussed objectives and other objectives are addressed by the present invention which provides a gas-dispersing showerhead assembly which is simple and inexpensive to both fabricate and maintain. The inventive showerhead assembly is easy to clean and may be temperature controlled utilizing the temperature control systems of the reaction chamber in which the showerhead assembly is installed, or through heat generated during the CVD process. To that end, the inventive showerhead assembly is particularly useful for depositing titanium nitride (TiN) and is effective to reduce the undesirable TiN deposition on the showerhead and also to reduce the chlorine content in the process and in the TiN film deposited on the substrate.

The inventive showerhead assembly comprises a plurality of stacked, plate-like elements which are held in place by an appropriately formed recess in the inner wall of a reaction chamber body. In one embodiment, the showerhead is formed as a plate-like element and is supported by the wall of the chamber. In another embodiment, insulator plates are stacked above and below the showerhead and the stacked plates are supported by the chamber walls. Specifically, the side wall of the reaction chamber body is machined to form a shelf which is configured for receiving the planar showerhead and the other plate-like elements which are stacked therewith, and for supporting those elements around their periphery. The reaction chamber shelf supports the stacked elements proximate the process space for introducing a process gas to a substrate in the process space. A lid is placed on the chamber body above the shelf and closes the process space for proper pressure maintenance therein for the CVD process. In that way, complicated mounting structures are eliminated while the reaction chamber body shelf maintains the elements in an orientation such that their planes are generally parallel to a substrate in the process space of the reaction chamber so that gas may be properly introduced to the process space and the showerhead may be used as an RF electrode.

In one embodiment of the invention, the showerhead is biased with RF energy and is electrically insulated from the metal reaction chamber body and lid. To provide electrical insulation between an RF biased showerhead and the metal reaction chamber, the insulator plates are positioned on the top and bottom of the showerhead between the showerhead and the reaction chamber body and lid. A lower insulator plate is positioned on the chamber body shelf and the showerhead is stacked on the top of the lower insulator plate. So that the process gas may pass through the showerhead and into the process space, the lower insulator plate is preferably in the form of an annular plate or ring having a central opening therein. The central opening coincides with the plurality of gas dispersing apertures in the showerhead. The annular ring insulates the showerhead at the periphery thereof where it would normally contact the shelf. For proper electrical biasing of the showerhead, the lower insulator plate preferably includes a passage formed therethrough for connecting an electrical energy source, such as an RF energy source, to the showerhead. In a preferred embodiment an RF line passage is formed through the chamber body, and the passage through the lower plate is aligned with the chamber body passage.

To provide electrical insulation along the top surface of the showerhead, an upper insulator plate is stacked on top of the showerhead and is positioned between the showerhead and the reaction chamber body and lid. To provide suitable insulation over the entire top surface of the showerhead, the upper insulator plate is generally coextensive with the showerhead, and does not include a central opening like the lower plate. Therefore, the upper insulator plate is generally in the form of a solid disk rather than a ring. A peripheral flange is formed around the periphery of the upper insulator plate to provide side insulation to the showerhead. The flange extends downwardly from the plane of the insulator plate and a bottom surface of the flange rests on the process chamber shelf to support the second insulator plate above the showerhead. The showerhead periphery is surrounded by the flange to electrically insulate the showerhead along its peripheral edge. The upper insulator plate creates a gas dispersion space above the showerhead where the process gas can accumulate before passing into the process space through the showerhead. A gas delivery line is formed in the upper insulator plate which couples the gas dispersion space above the showerhead to a process gas line formed in the chamber body. In that way, the process gas is pumped through the chamber body, into the gas dispersion space, and then through the showerhead and into the process space.

The stacked showerhead assembly of the invention provides a gas delivery assembly which is uncomplicated, durable, and inexpensive to fabricate and maintain. The assembly provides easy cleaning of the showerhead. Furthermore, the cooperation between the upper insulator plate and the lower insulator plate provides for proper temperature control of the susceptor in accordance with another principle of the present invention.

During CVD processes, it is generally desirable to maintain temperature control of the showerhead, and specifically to keep the showerhead within a desired temperature range. For example, to deposit titanium nitride (TiN), it is desirable to maintain all surfaces in the process space which contact the process gases at a temperature in the range of 125° C. to 225° C. to prevent premature and undesired deposition. Such a temperature range is lower than the average temperature at which the CVD occurs. If such low temperatures are desired for the showerhead, the insulator plates are formed of a thermally conducting material, such as aluminum nitride. The insulator plates then effectively thermally sink the showerhead to the reaction chamber wall and to the lid of the reaction chamber. A cooling system, which includes suitable cooling elements located in the body wall and/or lid of the reaction chamber, controls the temperature of the reaction chamber, and thus, controls the temperature of the showerhead. Similarly, if it is desirable to raise the temperature of the showerhead, a heating system, including heating elements in the body wall and/or lid of the chamber may be utilized. The thermally conductive insulator plates will then thermally sink the showerhead to the heated reaction chamber body and lid, and will thus heat the showerhead.

In accordance with another principle of the present invention, the showerhead might be heated by forming the upper and lower insulator plates from a material which is thermally insulating as well as electrically insulating. For example, quartz would serve such a purpose. The showerhead receives heat from the susceptor and substrate within the process chamber. Since the heat cannot be dissipated through the quartz insulator plates, the showerhead temperature will rise to a value which is roughly determined by the susceptor and substrate temperature.

In an alternative embodiment of the invention, if electrical isolation is not required, such as with a standard CVD process that does not require plasma enhancement, the showerhead is thermally coupled directly to the reaction chamber body and lid by supporting the showerhead on the shelf formed in the reaction chamber body. To that end, the upper and lower insulator plates are not utilized. The shelf is dimensioned to create a gas dispersion space proximate the upper surface of the showerhead for collecting process gas before it is dispersed through the showerhead.

It may be desirable to keep various of the process gases separated until they are dispersed into the process space. In an alternative embodiment of the invention, a dual-gas showerhead may be utilized which has sets of gas-dispersing openings or apertures which are physically isolated from other sets of openings in the showerhead. In one embodiment of such a showerhead, one process gas is delivered to the gas dispersion space above the showerhead and is dispersed through one set of showerhead openings, while another gas is delivered into an internal passage in the showerhead and is dispersed through another set of openings. The dual-gas showerhead may be utilized with or without the insulator plates.

As mentioned above, the present invention is particularly useful for depositing titanium nitride wherein it is desirable to maintain the temperature of the showerhead and any other elements which contact the process gases $TiCl_4$ and $NH_3$ in a temperature range between 125° C. and 225° C. By maintaining the showerhead at the desired temperature in accordance with the principles of the present invention, preferably little or no TiN will be deposited on the showerhead. Furthermore, the elimination of the deposition on the showerhead reduces the chlorine content in the deposited TiN film on the substrate, and also reduces corrosion caused by the chlorine generated during the process.

BRIEF DESCRIPTION OF THE DRAWINGS

The accompanying drawings, which are incorporated in and constitute a part of this specification, illustrate embodiments of the invention and, together with a general description of the invention given below, serve to explain the principles of the invention.

DETAILED DESCRIPTION OF THE INVENTION

Figure 1:
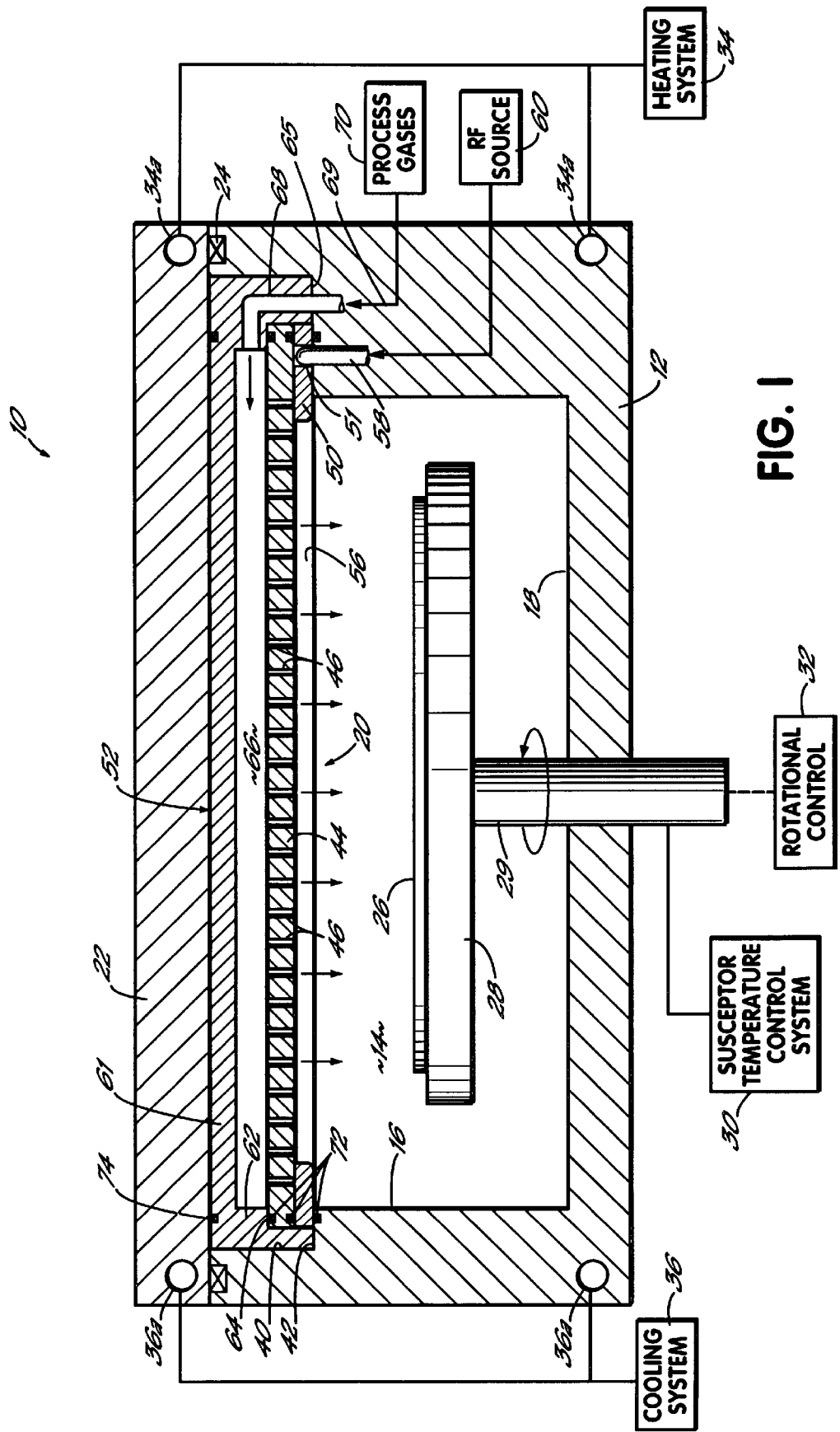
FIG. 1 is a schematic cross-sectional view of a reaction chamber utilizing the inventive showerhead assembly.

FIG. 1 illustrates a CVD reaction chamber 10 incorporating the present invention. The reaction chamber 10 includes a chamber body 12 formed of a suitable metal, such as stainless steel. The reaction chamber body 12 defines a process space 14 therein which is formed by an inner wall 16 and a bottom surface 18. The top of the process space is defined by a showerhead assembly 20 formed in accordance with the principles of the present invention. Closing the chamber body 12 and thereby enclosing the process space 14 and the showerhead assembly 20 is a chamber lid 22 which is also preferably formed of stainless steel. To provide for proper sealing between body 12 and lid 22, a seal, such as a conventional O-ring seal is utilized. For CVD and PECVD processes to be performed in the reaction chamber 10, the internal process space will require the conventional low pressure. To that end, reaction chamber 10 will be appropriately coupled to a source of vacuum (not shown), as is conventional.

For supporting a substrate 26, such as a silicon wafer, within process space 14, the reaction chamber 10 includes a substrate support or susceptor 28 which forms a support platform for substrate 26. Susceptor 28 rests on a base 29 and supports substrate 26 oriented generally parallel to showerhead assembly 20, as illustrated in FIG. 1. For a particular CVD or PECVD process, the substrate 26, and accordingly susceptor 28, might need to be heated and thus susceptor 28 may be coupled to a suitable temperature control system 30 through base 29. Also, it might be desirable to rotate susceptor 28 and the substrate 26 for uniform deposition onto the substrate. To that end, susceptor 28 might be coupled to an external rotational control system 32 through base 29. It will be readily understood by a person of ordinary skill in the art that other susceptor control systems, such as back plane heating systems and clamping systems (not shown) might also be utilized with susceptor 28 for heating and cooling the substrate 26 or securing substrate 26 to the susceptor 28.

In addition to heating and/or cooling substrate 26 on the susceptor 28, it will generally be desirable to heat and/or cool the reaction chamber 10. To that end, both the reaction chamber body 12 and lid 22 may be coupled to an appropriate heating system 34 and/or cooling system 36. The heating system 34 is coupled to appropriate conductive heating elements 34a which are conventionally embedded in the chamber body 12 and lid 22. Similarly, the cooling system is coupled to appropriate conductive cooling elements 36a embedded in the chamber body 12 and the lid 22. Such heating and cooling systems, including the various elements, are well known in the art and are commercially available for controlling the temperature of a reaction chamber 10.

In accordance with the principles of the present invention, the showerhead assembly 20 is formed of a series of stacked, plate-like elements, or plates, which are arranged in a stacked formation and are supported on a flat shelf created by a recess formed in the inner wall 16 of the reaction chamber body 12. In the embodiment illustrated in FIG. 1, the reaction chamber lid 22 is also generally planar in shape and thus may be considered another plate in addition to the inventive stacked showerhead assembly 20. Referring to FIG. 1, a flat shelf 42 is formed in the inner wall 16 of reaction chamber body 12 proximate lid 22 by machining an appropriate recess 40 around the inner wall 16 proximate the top of the chamber body. The shelf 42 is oriented generally horizontally within the reaction chamber 10. The shelf 42 extends around the inner wall 16 and is preferably formed and configured to receive the stacked formation of the showerhead assembly 20. The shelf supports the showerhead assembly at its periphery proximate the process space 14 and proximate substrate 26 for introducing process gas to the substrate. As discussed further below, the plate elements of the assembly rest on shelf 42 and the stacked formation is supported at its peripheral edge by the shelf.

The inventive showerhead assembly 20 includes a planar or plate-like showerhead 44 which has formed therein a series of gas-dispersing openings or apertures 46 for introducing a process gas to the process space 14. Showerhead 44 is preferably circular to match the circular cross-section of the cylindrically-shaped reaction chamber body 12 and is formed of an appropriate material such as aluminum.

Showerhead assembly 20 further includes a generally flat or planar lower insulator plate 50 and an upper insulator plate 52. The lower insulator plate is supported by the shelf 42 formed by a chamber body recess 40 and is positioned between the showerhead 44 and shelf 42 of the chamber body to electrically insulate showerhead 44 from the chamber body 12. As illustrated in FIG. 1, the lower insulator plate 50 is generally flat or planar in shape and, in a preferred embodiment, takes the form of an annular plate or ring having a central opening therein defined by reference numeral 56. The showerhead 44 rests on top of plate 50 and the two elements are generally coaxial and concentric and are supported at their peripheral edges by the shelf 42. Plate 50 thereby surrounds showerhead 44 at its periphery and prevents contact between the showerhead and chamber body 12, thus electrically insulating the showerhead from the chamber body. The central opening 56 is aligned with and corresponds to the position of the apertures 46 of the showerhead and thus opens the path between process space 14 and the showerhead 44 for allowing passage of the process gas from the showerhead and into the process space. That is, the lower insulator plate 50 generally will not interfere with the passage of gas through showerhead 44 and into its process space 14.

As discussed hereinabove, it is often desirable to electrically bias showerhead 44 with an RF energy source so that the showerhead acts as an electrode during a PECVD process. To that end, the embodiment of the lower insulator plate 50 illustrated in FIG. 1 includes an aperture 51 formed therethrough for coupling an electrical line 58 to the showerhead 44 by any conventional means known in the art. Electrical line 58, in turn, is coupled to an RF energy source 60 for biasing showerhead 44 as a RF electrode utilized for PECVD. To couple line 58 between the RF energy source 60 and showerhead 44, an appropriate passage is formed in chamber body 12.

The upper insulator plate 52 serves the dual function of not only electrically isolating and insulating showerhead 44 from the chamber body 12, but also from the reaction chamber lid 22. To that end, the upper insulator plate 52 includes a planar central portion 61 and the peripheral flange portion 62 which extends around the central portion 61. The central portion 61 is generally coextensive with the chamber lid 22 to electrically isolate the showerhead 44 from the chamber lid. The peripheral flange portion 62 depends downwardly from portion 61 and extends into the recess 40 formed in chamber body 12 and further electrically isolates showerhead 44. A lower surface 65 of flange portion 62 rests on shelf 42 to support insulator plate 52 on the shelf.

As seen in FIG. 1, the peripheral flange portion 62 contacts the lower insulator plate 50 and effectively traps the showerhead therebetween in a stacked fashion. To that end, the peripheral portion 62 of the upper insulator plate 52 includes a shelf 64 which cooperates with the lower insulator plate 50 to secure the showerhead between the two insulator plates. The lower insulator plate 50 is smaller in diameter than the inner diameter of the flange portion 62 of the upper insulator plate 52. Therefore, lower insulator plate 50 nests within upper insulator plate 52 to completely encase the showerhead. The outer peripheral edge of the lower insulator plate abuts against the shelf 64 of the upper insulator plate as shown in FIG. 1. Insulator plate 52 is also configured for forming a gas dispersion space 66 above the showerhead. The height of flange portion 62 above the showerhead elevates the central portion 61 to define space 66. The gas dispersion space 66 is essentially formed between the showerhead 44 and the lid 22. The upper insulator plate 52 effectively electrically insulates showerhead 44 from the lid 22 and chamber body 12 while maintaining a sufficient dispersion space so that gas may be introduced on one side of the showerhead and then dispersed therethrough to the process space 14 and substrate 26. The lower insulator plate 50 is dimensioned in diameter to fit inside the peripheral flange portion 62 as shown in FIG. 1 to form a complete insulative casing for the showerhead. To introduce the process gas, a gas delivery passage 68 is formed in the upper insulator plate 52 and couples with a gas delivery passage 69 which may be appropriately formed in chamber body 12, as shown. The passages 68, 69 are coupled to a supply of process gases 70 for delivering a process gas to space 66 for being dispersed through showerhead 44. In that way, the gas delivery passages 68, 69 communicate with showerhead 44 to deliver process gas thereto. The type of process gas utilized will be dependent upon the particular CVD or PECVD process which is desired.

To prevent gases from escaping the reaction chamber 12, the lower insulator plate 50, upper insulator plate 52, and showerhead 44 are preferably finely and precisely machined so that when positioned in the stacked assembly 20, shown in FIG. 1, a proper seal will be created around their peripheral edges to prevent the migration of gas from process space 14 out to the seal 24. Alternatively, other seals, such as O-ring seals 72, might be utilized at the various interface surfaces between the lower insulator plate 50, the showerhead 44, and the upper insulator plate 52, as well as the interface surfaces between the upper insulator plate 52 and the lid 22 as illustrated by O-ring seal 74. As will be understood by a person of ordinary skill in the art, other suitable sealing structures might also be utilized. For example, a commonly used spring seal might be used to replace the various O-ring seals shown.

In accordance with another principle of the present invention, showerhead assembly 20 may be utilized to provide indirect temperature control of the showerhead utilizing the reaction chamber body 12 and lid 22. To that end, the lower insulator plate 50 and the upper insulator plate 52 are made of a thermally conducting yet electrically insulating material such as aluminum nitride. As discussed above, the reaction chamber body 12 and lid 22 may be coupled to a heating system 34 through elements 34a, or alternatively, to a cooling system 36 through elements 36a for selectively heating and cooling reaction chamber 10. Utilizing the showerhead assembly 20 illustrated in FIG. 1, when the lower insulator plate 50 and upper insulator plate 52 are in position with the showerhead 44 stacked therebetween, the showerhead will effectively be thermally conductively coupled to the reaction chamber body 12 and to lid 22. In that way, the showerhead can be conductively maintained at a temperature which is near the temperature of the reaction chamber 10 as maintained by a heating system 34 or a cooling system 36. The contact surface interfaces between the insulator plates 50, 52 and showerhead 54 will conduct heat to and away from the showerhead as dictated by the temperature of the chamber.

One particular benefit of maintaining a cool showerhead, in accordance with the principles of the present invention, is realized when utilizing the reaction chamber 10 to deposit titanium nitride. The process gases utilized for one conventional CVD method for titanium nitride are $TiCl_4$ and $NH_3$. It is desirable, when utilizing $TiCl_4$ and $NH_3$ to maintain all surfaces which come into contact with those process gases at a temperature in the range of 125° C. and 225° C. to prevent premature and undesired deposition on those surfaces. In the past, this has been possible for the reaction chamber surface by utilizing the various heating and cooling systems as discussed above. However, it has not generally been possible for the showerhead and showerhead surfaces until the present invention. By thermally coupling or sinking the showerhead 44 to the reaction chamber 10 through the insulator plates 50, 52 which are formed of a thermally conducting material, the surfaces of showerhead 44 may be maintained in the desired temperature range so that titanium nitride deposition on the showerhead is minimized.

Thermally conductively sinking the showerhead to the reaction chamber through insulator plates made of a thermally conducting material also provides benefits to the layer of titanium nitride deposited onto substrate 26 by reducing the chlorine (Cl) content of the layer and reducing layer corrosion. More specifically, by eliminating the undesired titanium nitride deposition on the showerhead, the content of chlorine in the form of HCl in the process space 14 is reduced. HCl is a by-product of the reaction between $TiCl_4$ and $NH_3$ to form titanium nitride. HCl is corrosive to the titanium nitride and, therefore, reduction of the HCl production reduces corrosion of the deposited layer to provide for a titanium nitride layer of high quality on substrate 26. Furthermore, it is anticipated that the HCl reduction will also reduce the chlorine content of the layers and films deposited on substrate 26. Chlorine in the deposited TiN layer detrimentally affects the properties of the layer.

In accordance with another principle of the present invention, it may be desired to heat showerhead 44. As discussed above, such heating might be accomplished through thermally sinking the showerhead to reaction chamber 10 with insulator plates 50, 52 which are made of a thermally conducting material, and then coupling a heating system 34 to the reaction chamber, However, another method of heating a showerhead involves forming the lower insulator plate 50 and upper insulator plate 52 of a thermally insulating material, such as quartz. Showerhead 44 will receive heat from susceptor 28 and substrate 26 during a CVD reaction. The heat delivered to the showerhead cannot be conductively dissipated to the reaction chamber through the lower and upper insulator plates 50, 52. Therefore, the showerhead temperature will rise to a certain value, which is generally determined by the temperature of the susceptor 28 and substrate 26. It is recognized that less independent control of the showerhead temperature is provided by such a method as opposed to thermally sinking the showerhead to the reaction chamber using thermally conductive insulator plates 50, 52.

The assembly 20 is easily assembled and disassembled and is thus easily maintained. The tacked plate-like elements may be readily removed for cleaning and maintenance, and are not connected together by separate fasteners.

Figure 2:
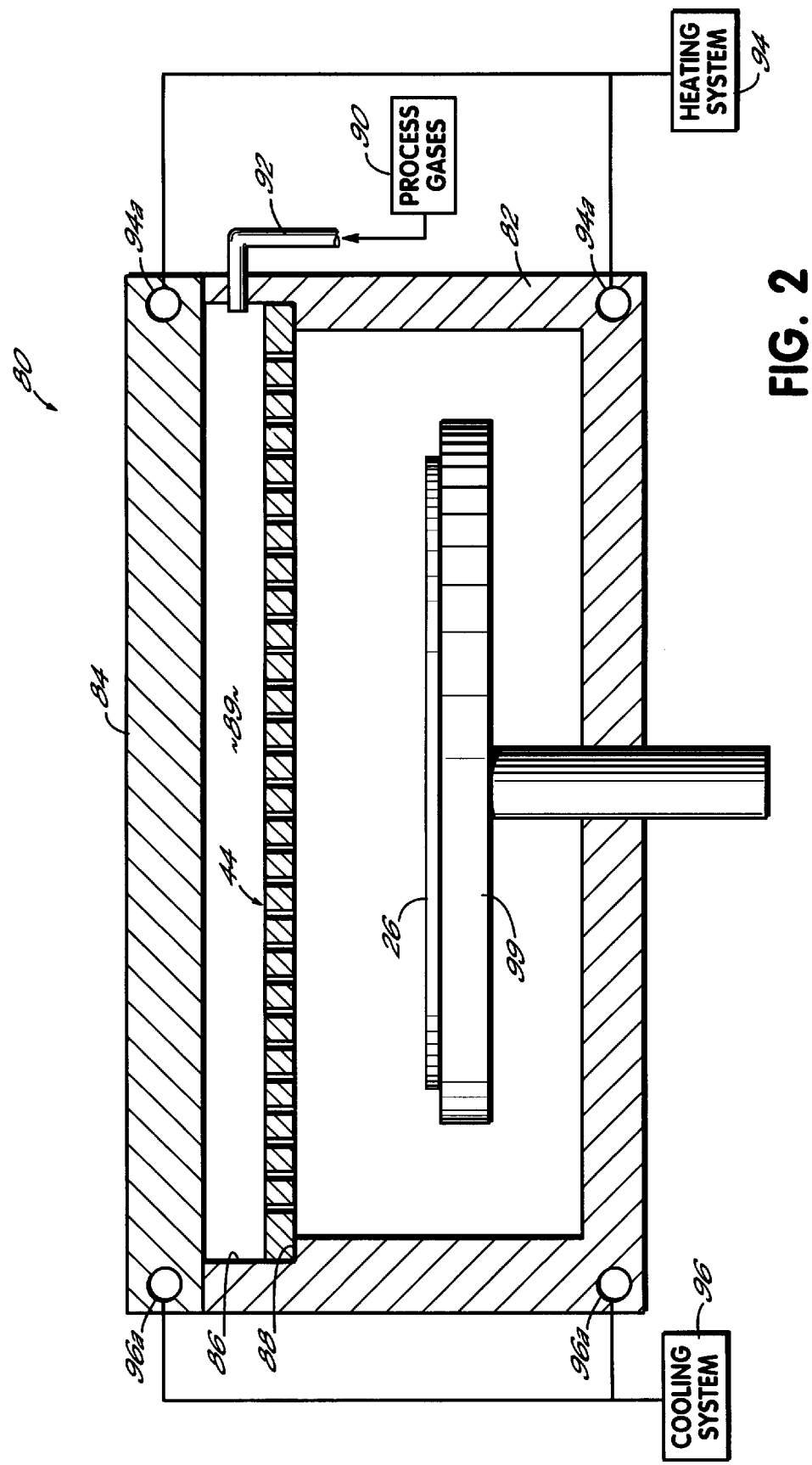
FIG. 2 is a schematic cross-sectional view of an alternative embodiment of a reaction chamber utilizing the present invention.

FIG. 2 illustrates an alternative embodiment of the present invention wherein it is not necessary to electrically insulate showerhead 44 from reaction chamber 10. That is, chamber 80 will be used for thermal CVD and RF biasing of showerhead 44 is not required. To that end, the lower insulator plate 50 and upper insulator plate 52 may be eliminated and showerhead 44 will be directly mounted in reaction chamber 80 having a body 82 and a lid 84. A recess 86, including a shelf 88, is formed in the reaction chamber body 82 such that showerhead 44 is mounted and supported on shelf 88. Shelf 88 is constructed in body 82 such that between the lid 84 and showerhead 44, a gas dispersion space 89 is formed which is coupled to a source of process gas 90 through an appropriate line 92. A portion of the line is formed in the chamber body 82 for the purposes of coupling with space 89.

In the embodiment illustrated in FIG. 2, the metal showerhead 44 is thermally coupled directly to reaction chamber 80 through its connection to shelf 88. With showerhead directly thermally sunk to the body 82 and lid 84 of the reaction chamber, the showerhead may be heated and cooled directly by heating and cooling reaction chamber 80 with an appropriate heating system 94 and elements 94a, or a cooling system 96 and elements 96a. The embodiment illustrated in FIG. 2 is easily and inexpensively manufactured and assembled and maintained in accordance with the principles of the present invention. Furthermore, temperature control of the showerhead is provided. As mentioned above, the embodiment of FIG. 2 is particularly useful for deposition of titanium nitride to reduce deposition on the showerhead 44 and also to reduce the chlorine content in the film layer and corrosion of the layer on the substrate 26. To support substrate 26, a susceptor 99, similar to the susceptor illustrated in FIG. 1 and utilizing the various components and systems thereof, might be utilized.

Figure 3:
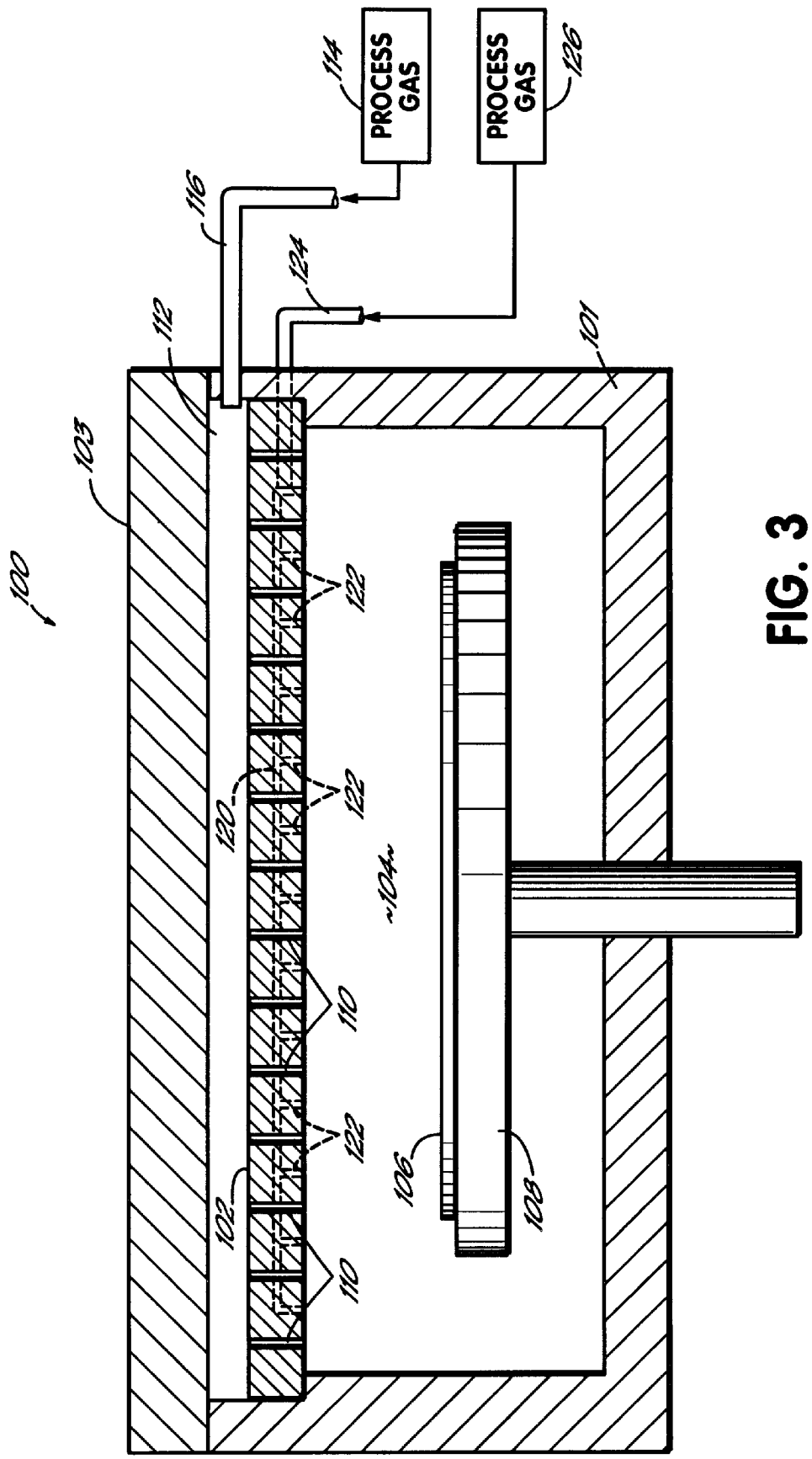
FIG. 3 is a schematic cross-sectional view of another alternative embodiment of a reaction chamber utilizing the present invention.

FIG. 3 illustrates a reaction chamber 100 utilizing another alternative embodiment of the showerhead. Showerhead 102 is designed for introducing two different process gases into a process space 104 and proximate a substrate 106 without mixing the two gases prior to the process space. Substrate 106 is supported on a susceptor 108 similar to the susceptors discussed hereinabove. Showerhead 102, while being shown in the reaction chamber 100 might also be utilized in the reaction chamber 10 illustrated in FIG. 1, as well as in reaction chamber 80 shown in FIG. 2. That is, while FIG. 3 shows showerhead 102 thermally and electrically coupled directly to reaction chamber 100, showerhead 102 might also be electrically and/or thermally insulated from the reaction chamber utilizing insulator plates as disclosed above.

Showerhead 102 includes a series of passages 110 formed therein which are coupled to a gas dispersion space 112. Process gas from a supply 114 is coupled to space 112 through a gas delivery line 116, a portion of which is formed in the chamber body 101. Of course, line 116 might also be directed through the lid 103 of chamber 100 with an appropriate portion of the line being formed through lid 103 which may also be done in the reaction chambers 10, 80, discussed above. Gas introduced from supply 114 travels through the dispersion space 112 and then is directed through the gas dispersing passages 110 into the process space 104 proximate substrate 106. Showerhead 102 is also configured to include a second gas dispersion space 120 which is coupled to a plurality of passages 122 which may be similar in shape and dimension to the passages 110. Space 120 is coupled to an appropriate gas delivery line 124, a portion of which is formed in the chamber body 101. Line 124, in turn, is coupled to a supply of process gas 126. For example, when depositing titanium nitride, the $TiCl_4$ gas might be introduced through line 124 and the passages 122 while the other process gases, such as $NH_3$ might be introduced through line 116 and passages 110. In that way, the two gases are prevented from mixing in the showerhead and only mix in process space 104 proximate substrate 106. As discussed in co-pending U.S. application Ser. No. 08/940,779, it is desirable to prevent the premature mixture of the constituent gases to further prevent undesired deposition on the showerhead 102 or in the gas dispersing passages 110, 122. As mentioned above, showerhead 102 might also be utilized with insulator plates for electrically and/or thermally insulating the showerhead in accordance with the principles of the present invention.

While the present invention has been illustrated by the description of the embodiments thereof, and while the embodiments have been described in considerable detail, it is not the. intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. A reaction chamber for chemical vapor deposition of a material layer onto a substrate using a process gas, the reaction chamber comprising:

a chamber body having an inner wall which defines a process space for containing a substrate;

a lid configured for coupling with the chamber body to effectively close the process space;

a planar showerhead positioned inside the chamber body for dispersing a process gas into the process space;

a shelf formed in the inner wall of the chamber body, the chamber body shelf configured for receiving the showerhead and supporting the showerhead at its peripheral edge proximate the process space for introducing a process gas to a substrate in the process space;

whereby a gas delivery system is provided for chemical vapor deposition.

2. The reaction chamber of claim 1 further comprising a first gas dispersion space proximate one side of said showerhead when the showerhead is supported by the shelf, the gas dispersion space operable for accumulating process gas delivered to the reaction chamber before it is dispersed through the showerhead.

3. The reaction chamber of claim 2 wherein the gas dispersion space is defined between said lid and the showerhead.

4. The reaction chamber of claim 2 further comprising a gas delivery passage formed in the chamber body, the gas delivery passage operably communicating with said gas dispersion space for delivering a process gas to the showerhead.

5. The reaction chamber of claim 1 further comprising a gas delivery passage formed in the chamber body, the gas delivery passage operably communicating with said showerhead for delivering a process gas to the showerhead to be dispersed into the process space.

6. The reaction chamber of claim 1 further comprising a passage formed in the chamber body for coupling a source of electrical energy to the showerhead for electrically biasing the showerhead.

7. The reaction chamber of claim 1 further comprising a first insulator plate supported by the chamber body shelf, the first insulator plate being positioned between the showerhead and the chamber body for electrically insulating the showerhead from the chamber body.

8. The reaction chamber of claim 7 wherein said first insulator plate is in the form of a ring having a central opening therein, the ring contacting said showerhead at a periphery thereof to insulate the showerhead, the central opening being aligned with gas-dispersing openings in the showerhead for introducing gas into the process space.

9. The reaction chamber of claim 7 wherein said first insulator plate includes a passage formed therethrough for coupling a source of electrical energy to the showerhead through the first insulator plate to electrically bias the showerhead.

10. The reaction chamber of claim 7 wherein said first insulator plate is formed of a thermally conducting material.

11. The reaction chamber of claim 7 wherein said first insulator plate is formed of a thermally insulating material.

12. The reaction chamber of claim 1 further comprising an second insulator plate supported by the chamber body shelf, the second insulator plate being positioned between the showerhead and the chamber body and lid for electrically insulating the showerhead from the chamber body and lid.

13. The reaction chamber of claim 12 wherein said second insulator plate is formed of a thermally conducting material.

14. The reaction chamber of claim 12 wherein said second insulator plate is formed of a thermally insulating material.

15. The reaction chamber of claim 12 wherein the second insulator plate forms a gas dispersion space proximate one side of said showerhead, the gas dispersion space operable for accumulating process gas delivered to the reaction chamber before it is dispersed through the showerhead.

16. The reaction chamber of claim 12 wherein said second insulator plate includes a peripheral flange portion depending downwardly from a central portion, the peripheral flange portion being supported by the shelf.

17. The reaction chamber of claim 12 wherein said second insulator plate includes a gas delivery passage formed therein for delivering process gas to the showerhead to be dispersed in the process space.

18. The reaction chamber of claim 1 wherein said showerhead comprises a second gas dispersion space, the second gas dispersion space being isolated from the first gas dispersion space so that different process gases may be dispersed through the showerhead without mixing prior to being dispersed.

19. A reaction chamber for chemical vapor deposition of a material layer onto a substrate using a process gas, the reaction chamber comprising:

a chamber body having an inner wall which defines a process space for containing a substrate;

a lid configured for coupling with the chamber body to effectively close the process space;

a planar showerhead positioned inside the chamber body for dispersing a process gas into the process space;

a frist insulator plate positioned on one side of the showerhead between the showerhead and the chamber body for electrically insulating the showerhead from the chamber body;

an second insulator plate positioned on the other side of the showerhead between the showerhead and the chamber body and lid for electrically insulating the showerhead from the chamber body and lid;

a shelf formed in the inner wall of the chamber body;

the planar showerhead and second and first insulator plates being arranged in a stacked formation, the stacked formation being positioned on said shelf and supported at its peripheral edge proximate the process space for introducing a process gas to a substrate in the process space;

whereby a gas delivery system is provided for chemical vapor deposition.

20. The reaction chamber of claim 19 wherein said stacked formation defines a first gas dispersion space proximate one side of said showerhead, the gas dispersion space operable for accumulating process gas delivered to the reaction chamber before it is dispersed through the showerhead.

21. The reaction chamber of claim 19 wherein said first insulator plate is in the form of a ring having a central opening therein, the central opening being aligned with gas-dispersing apertures in the showerhead for introducing process gas into the process space.

22. The reaction chamber of claim 19 wherein said first insulator plate includes a passage formed therethrough for coupling a source of electrical energy to the showerhead through the first insulator plate to electrically bias the showerhead.

23. The reaction chamber of claim 19 wherein said first insulator plate is formed of a thermally conducting material.

24. The reaction chamber of claim 19 wherein said first insulator plate is formed of a thermally insulating material.

25. The reaction chamber of claim 19 wherein said second insulator plate is formed of a thermally conducting material.

26. The reaction chamber of claim 19 wherein said second insulator plate is formed of a thermally insulating material.

27. The reaction chamber of claim 19 wherein said second insulator plate includes a gas delivery passage formed therein for delivering process gas to the showerhead to be dispersed in the process space.

28. The reaction chamber of claim 19 wherein said showerhead comprises a second gas dispersion space, the second gas dispersion space being isolated from the first gas dispersion space so that different process gases may be dispersed through the showerhead without mixing prior to being dispersed.

29. A chemical vapor deposition method for applying a material layer onto a substrate using a process gas, the method comprising:

providing a reaction chamber having an inner wall which defines a process space for containing a substrate;

placing a substrate in the process space;

forming a shelf in the inner wall of the chamber proximate the process space;

positioning a planar showerhead inside the chamber for dispersing a process gas into the process space, and stacking the showerhead on the shelf so that it is supported at its peripheral edge proximate the process space for introducing a process gas to the substrate in the process space.

30. The method of claim 29 reaction chamber of claim 1 further comprising stacking a first insulator plate on the chamber shelf below the showerhead such that the first insulator plate is positioned between the showerhead and the chamber and electrically insulates the showerhead from the chamber.

31. The method of claim 30 wherein said first insulator plate is in the form of a ring having a central opening therein, the method further comprising positioning the ring concentrically with the showerhead so that the central opening is aligned with gas-dispersing openings in the showerhead for introducing gas into the process space.

32. The method of claim 29 further comprising stacking an second insulator plate on the chamber shelf above the showerhead, the second insulator plate being positioned between the showerhead and the chamber for electrically insulating the showerhead from the chamber.

33. The method of claim 29 wherein said second insulator plate includes a peripheral flange portion depending downwardly from a central portion, the peripheral flange portion being supported by the shelf, the method further comprising positioning the first insulator plate inside of the second insulator plate for completely encasing the showerhead and insulating the showerhead from the chamber.

* * * * *

UNITED STATES PATENT AND TRADEMARK OFFICE
CERTIFICATE OF CORRECTION

PATENT NO. : 5,997,649            Page 1 of 2
DATED : December 7, 1999
INVENTOR(S) : Joseph T. Hillman It is certified that error appears in the above-identified patent and that said Letters Patent is hereby corrected as shown below:

Column 2,
Line 51 reads "$TiCL_4$" and should read -- $TiCl_4$ --.

Column 5,
Line 35 reads "$TiCL_4$" and should read -- $TiCl_4$ --.

Column 9,
Lines 5, and 6 reads "$TiCL_4$" and should read -- $TiCl_4$ --.
Line 24 reads "chlorine (CI)" and should read -- chlorine (Cl) --
Lines 27-30, and 33, reads "HCI" and should read -- HCl --
Line 28 reads "$TiCL_4$" and should read -- $TiCl_4$ --.

Claim 12,
Line 1 reads "an second" and should read -- a second --.

Claim 18,
Line 1 reads "claim 1" and should read -- claim 2 --.

Claim 19,
Line 10 reads "a frist" and should read -- a first --.
Line 14 reads "an second" and should read -- a second --.

Claim 28,
Line 1 reads "claim 19" and should read -- claim 20 --.

UNITED STATES PATENT AND TRADEMARK OFFICE
CERTIFICATE OF CORRECTION

PATENT NO.   : 5,997,649
DATED        : December 7, 1999
INVENTOR(S)  : Joseph T. Hillman It is certified that error appears in the above-identified patent and that said Letters Patent is hereby corrected as shown below:

Claim 32,
Line 2 reads "an second" and should read -- a second --.

Signed and Sealed this

Fourth Day of September, 2001

Attest:

*Nicholas P. Godici*

NICHOLAS P. GODICI
*Attesting Officer*     *Acting Director of the United States Patent and Trademark Office*